(12) United States Patent
Daveau et al.

(10) Patent No.: US 11,973,130 B2
(45) Date of Patent: Apr. 30, 2024

(54) METHOD OF FORMING ASYMMETRIC DIFFERENTIAL SPACERS FOR OPTIMIZED MOSFET PERFORMANCE AND OPTIMIZED MOSFET AND SONOS CO-INTEGRATION

(71) Applicant: X-FAB France SAS, Corbeil-Essonnes (FR)

(72) Inventors: Sébastien Daveau, Hericy (FR); Sotirios Athanasiou, Corbeil-Essonnes (FR)

(73) Assignee: X-FAB FRANCE SAS, Corbeil-Essonnes (FR)

( * ) Notice: Subject to any disclaimer, the term of this patent is extended or adjusted under 35 U.S.C. 154(b) by 158 days.

(21) Appl. No.: 17/159,319

(22) Filed: Jan. 27, 2021

(65) Prior Publication Data

US 2021/0234024 A1 Jul. 29, 2021

(30) Foreign Application Priority Data

Jan. 28, 2020 (GB) ..................................... 2001187

(51) Int. Cl.
*H01L 29/66* (2006.01)
*H01L 21/02* (2006.01)
(Continued)

(52) U.S. Cl.
CPC .... *H01L 29/66833* (2013.01); *H01L 21/0217* (2013.01); *H01L 21/02244* (2013.01);
(Continued)

(58) Field of Classification Search
CPC ........... H01L 29/66833; H01L 21/0217; H01L 21/02244; H01L 21/266; H01L 21/3111; H01L 29/7833; H01L 29/792
See application file for complete search history.

(56) References Cited

U.S. PATENT DOCUMENTS 5,707,897 A * 1/1998 Lee .................... H01L 29/42324
438/257
5,861,347 A * 1/1999 Maiti ................ H01L 21/28211
438/257
(Continued)

FOREIGN PATENT DOCUMENTS

CN 105981158 9/2016
EP 1677359 5/2006
(Continued)

OTHER PUBLICATIONS

Search Report and Written Opinion for Application No. GB2001187.0, dated Oct. 7, 2020, 9 pages.

*Primary Examiner* — Telly D Green
*Assistant Examiner* — Andre C Stevenson
(74) *Attorney, Agent, or Firm* — Dority & Manning, P.A.

(57) ABSTRACT

A method of manufacturing of a semiconductor device, comprising: providing a semiconductor substrate having a first region, a second region and a third region; on the first region, providing a first thin dielectric layer; on the second region, providing a second thick dielectric layer; on the third region, providing an ONO stack; on each of the first, second and third regions, providing at least one gate structure; performing an oxidation step so as to form an oxide layer on each of the gate structures of the first, second and third regions and exposed portions of the first and second dielectric layers; providing a first tetraethyl orthosilicate, TEOS, layer across the second and third regions; blanket depositing a first silicon nitride, SiN, layer across the first, second and third regions; and etching the first SiN layer leaving at least some of said first SiN layer on each gate structure of the first, second and third regions so as to form a first SiN sidewall spacer portion on each gate structure of the first, second and
(Continued)

third regions, wherein at least part of the ONO stack is protected from the etching by the first TEOS layer.

28 Claims, 13 Drawing Sheets

(51) Int. Cl.
    *H01L 21/266*     (2006.01)
    *H01L 21/311*     (2006.01)
    *H01L 29/78*     (2006.01)
    *H01L 29/792*     (2006.01)

(52) U.S. Cl.
    CPC ...... *H01L 21/266* (2013.01); *H01L 21/31111* (2013.01); *H01L 29/7833* (2013.01); *H01L 29/792* (2013.01)

(56) References Cited

U.S. PATENT DOCUMENTS

| | | | |
|---|---|---|---|
| 8,071,453 B1 | 12/2011 | Ramkumar et al. | |
| 8,722,496 B1* | 5/2014 | Roizin | H01L 29/40117 |
| | | | 438/257 |
| 8,916,432 B1 | 12/2014 | Ramkumar et al. | |
| 2002/0123180 A1 | 9/2002 | Rabkin et al. | |
| 2004/0029319 A1 | 2/2004 | Rudeck | |
| 2008/0116447 A1* | 5/2008 | Lojek | H01L 29/792 |
| | | | 257/E21.21 |
| 2008/0157165 A1 | 7/2008 | Park | |
| 2009/0152616 A1* | 6/2009 | Kim | H01L 27/11521 |
| | | | 257/E47.001 |
| 2014/0097480 A1* | 4/2014 | Shum | H01L 29/66825 |
| | | | 438/257 |
| 2014/0242796 A1 | 8/2014 | Toba et al. | |
| 2015/0171104 A1 | 6/2015 | Prabhakar et al. | |
| 2017/0221917 A1 | 8/2017 | Shinohara | |

FOREIGN PATENT DOCUMENTS

| | | |
|---|---|---|
| WO | WO 01/29894 | 4/2001 |
| WO | WO2013148393 | 10/2013 |

* cited by examiner

METHOD OF FORMING ASYMMETRIC DIFFERENTIAL SPACERS FOR OPTIMIZED MOSFET PERFORMANCE AND OPTIMIZED MOSFET AND SONOS CO-INTEGRATION

TECHNICAL FIELD

The present invention relates to semiconductor device manufacture methods, and in particular, to a method for manufacturing a semiconductor device having both Metal-Oxide-Semiconductor Field Effect Transistor (MOSFET) and Silicon-Oxide-Nitride-Oxide-Silicon (SONOS) devices integrated on a single substrate.

BACKGROUND

The Metal-Oxide-Semiconductor (MOS) field-effect transistor has become the most widely used transistor in digital electronics. Typically, a MOS transistor comprises a conductive gate electrode on a semiconductor substrate, with an oxide film interposed there between, and a carrier source and drain on opposite sides of the gate. The voltage of the gate (gate voltage) determines the conductivity of the device. By applying a voltage to the gate, the conductivity of the device can be inverted, meaning a MOS transistor can be used in logic circuitry, i.e. to amplify or switch electronic signals.

A Silicon-Oxide-Nitride-Oxide-Silicon (SONOS) transistor differs from a standard MOS transistor in that a layer of silicon nitride is inserted inside the transistors oxide film. In this way, the nitride layer is electrically isolated from the surrounding transistor. Traps in the nitride layer can capture and retain carriers injected from the channel of a MOS transistor, allowing the SONOS device to operate as a type of memory, known as charge trap memory.

For many applications, it is desirable to integrate logic circuitry based upon MOS transistors alongside SONOS transistors on a single chip or substrate, to create Non-Volatile Memory (NVM). However, the integration of these dissimilar devices can be challenging. Firstly, many common plasma-etching techniques used in semiconductor fabrication use a thermal oxide layer to stop the etching process. This is not compatible with a SONOS-first approach (i.e. integrate ONO stack before the core MOSFET devices) since the thermal oxide layer will be the top of the ONO stack and can be partially or completely be consumed.

Further challenges arise when integrating complementary n- and p-type MOS devices (CMOS), alongside SONOS transistors on a single chip. Typically, pMOS and nMOS devices have completely different requirements, for example, due to p-type ion diffusion. Typically, the lighter the ion, the stronger the diffusion effect. For instance, for p-type doping, suitable species include Boron, Gallium and Indium. Out of these species, boron has the lowest atomic weight (with an atomic mass of 10.81), meaning that is has the strongest diffusion effect.

It can also be desirable to integrate MOS devices having different operating voltages on the same chip. The width of a sidewall spacer formed adjacent a gate may determine the distance between the source/drain implants and the gate, and thus, the electric field between them. As such, for a semiconductor device with transistors having different operating voltages, it is desirable to have a method wherein two different sidewall spacer widths can be created—without adding an excessive number of steps to the manufacturing process.

In light of the above, there is a need for a method suitable for integrating different types of MOS devices (e.g. nMOS transistors, pMOS transistors, and/or transistors having different operating voltages), alongside SONOS devices on a single substrate, which takes into account the different requirements and properties of said devices.

SUMMARY OF THE INVENTION

According to an aspect of the present invention there is provided a method of manufacturing a semiconductor device, and a semiconductor device, as set out in the accompanying claims.

In one broad aspect, the invention may be a method of forming different voltage MOSFETs together with SONOS devices on the same substrate, in which different sidewall spacers are used during doping of different MOSFETs of the same voltage. For example, a thicker sidewall can be used during the implanting of a p-type dopant for p-type lightly doped drain (PLDD) portions compared to n-type lightly doped drain (NLDD) portions, in order to avoid diffusion problems.

In another broad aspect, the invention may be a method of forming different voltage MOSFETs together with SONOS devices on the same substrate, in which, during dry etching to remove a SiN layer from the SONOS devices, at least part of the ONO stack (forming the central part of the SONOS device) is protected by a tetraethyl orthosilicate (TEOS) layer.

Any of the steps described below, or any of the steps described in the accompanying claims, may be incorporated in either of these aspects.

Preferred embodiments of the invention will now be described, by way of example only, with reference to the accompanying drawings.

DETAILED DESCRIPTION

Figure 1A:
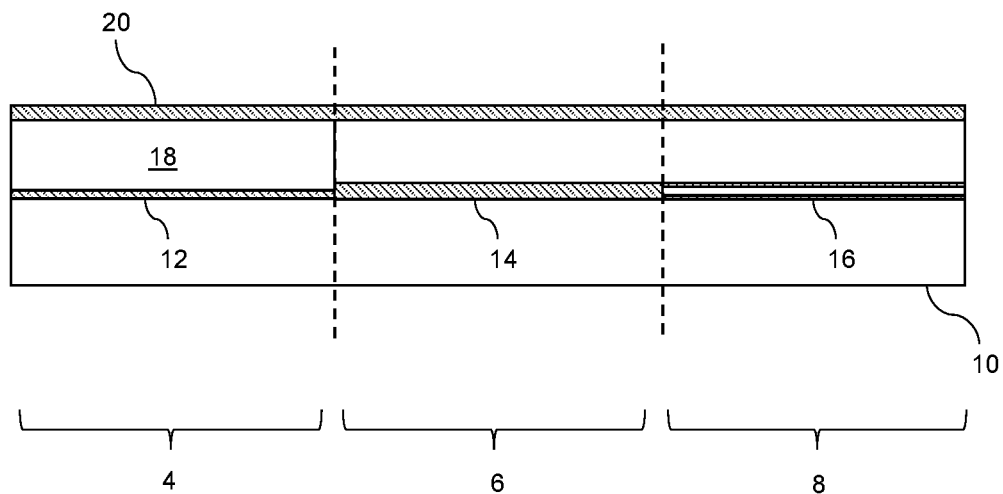
FIGS. 1A-1S are cross-sectional views of a portion of a semiconductor device at sequential manufacturing stages according to an embodiment of the present invention.

Embodiments described herein provide a method of integrating MOS transistors and SONOS transistors on the same chip. The method begins with providing a semiconductor substrate 10. The substrate 10 may be a wafer composed of silicon, germanium, silicon-germanium or a III-V compound semiconductor material, or a silicon on insulator (SOI) wafer. As shown in FIG. 1A, the substrate 10 is divided into a first region 4, a second region 6, and a third region 8. By way of example, in FIG. 1A, the second region 6 is provided in between the first region 4 and the third region 8, though in principle any arrangement of the regions 4, 6, 8 could be implemented.

The first region 4 and second region 6 may support different types of MOS transistors. For instance, first region 4 may support a 1.2-2.5 V device (for example a 1.5 V device), whereas the second region 6 may support a 3.3-5 V device (for example a 5 V device). On the first region 4 of the substrate 10, a thin dielectric layer 12 is provided, as illustrated in FIG. 1A. The first thin dielectric layer 12 may be silicon dioxide (SiO2), silicon oxinitride (SiO$_x$N$_x$) or a High-K Metal Gate stack (HKMG) comprising of a High-K dielectric like Hafnium oxinitride (HfON) deposited by atomic layer deposition (ALD) and a metal alloy like titanium nitride (TiN) deposited by physical vapor deposition (PVD), having a thickness of 22 to 70 Angstroms. In some embodiments, the thin dielectric layer 12 can be grown by a thermal oxidation process. Likewise, on the second region 6 of substrate 10, a second thick dielectric layer 14 is provided. In this example, the second thick dielectric layer 14 is thicker than the thin dielectric layer 12. The second thick dielectric layer 14 may be of the order of 50-150 Angstroms. The thick dielectric layer 14 may also be grown by a thermal oxidation process.

On the third region 8 of the substrate 10, an Oxide-Nitride-Oxide (ONO) stack 16 is provided. In order to form the ONO stack 16, the bottom oxide layer and nitride layer are deposited (for example, via CVD), whereas the top oxide layer is grown by consuming silicon present inside the nitride. The ONO stack 16 typically has a thickness of the order of 90-200 Angstroms.

Overlying each of the first thin dielectric layer 12, the second thick dielectric layer 14, and the ONO stack 16, a gate material 18 is provided. The gate material 18 may be composed of any suitable conductive gate material, such as polysilicon, metal or SiGe. In some embodiments, the gate material 18 is deposited concurrently over the three regions 4, 6, 8. The gate material 18 in some cases a polycrystalline silicon (p-Si), may have a thickness of the order of 1500-1700 Angstroms. In this way, on the third region 8, a SONOS stack is formed, comprising (from bottom to top) the substrate 10, the ONO stack 16, and the gate material 18.

Overlying the gate material layer 18, a hard mask 20 is provided across the three regions 4, 6, 8. The hard mask 20 may be formed concurrently over the three regions 4, 6, 8, for example, by deposition of any suitable material, such as tetraethyl orthosilicate (TEOS).

Figure 1B:
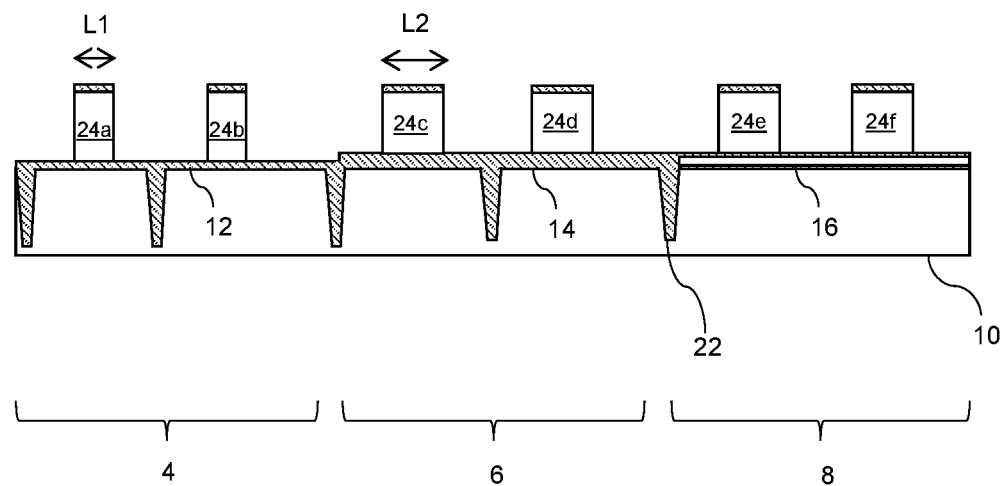

In some embodiments, the method includes forming a plurality of isolation structures 22 in the substrate 10, as shown in FIG. 1B. Typically, an isolation structure 22 is a structure configured to isolates a transistor from a neighbouring transistor and/or area. The isolation structures 22 may comprise a dielectric material, such as an oxide or nitride, and may be formed by any suitable technique known in the art, such as shallow trench isolation (STI) or local oxidation of silicon (LO-COS).

Referring to FIG. 1B, next, the method comprises providing at least one gate structure 24a-f on each of the first 4, second 6 and third 8 regions. In this example, a first and a second gate structure is provided on each region 4, 6, 8. In some embodiments, the gate structures 24a-f are formed by photolithographic patterning and dry (e.g. plasma) etching. In the embodiment shown in FIG. 1B, a first and a second gate structure 24a, 24b are provided on the first region 4, and a first and a second gate structure 24c, 24d are provided on the second region 6. The gate structures 24a, 24b of the first region 4 have a minimum gate length L1 which is smaller than the minimum gate length L2 of the second region 6, as illustrated in FIG. 1B. For instance, the gate structures 24a, 24b of the first region 4 may have a minimum gate length L1 of the order 110 nm, while the gate structures 24c, 24d of the second region 6 have a minimum gate length L2 of 600 nm.

In this way, the first region 4 may support a 1.2-2.5 V device, whereas the second region 6 may support a 3.3-5 V device, as described above.

Figure 1C:
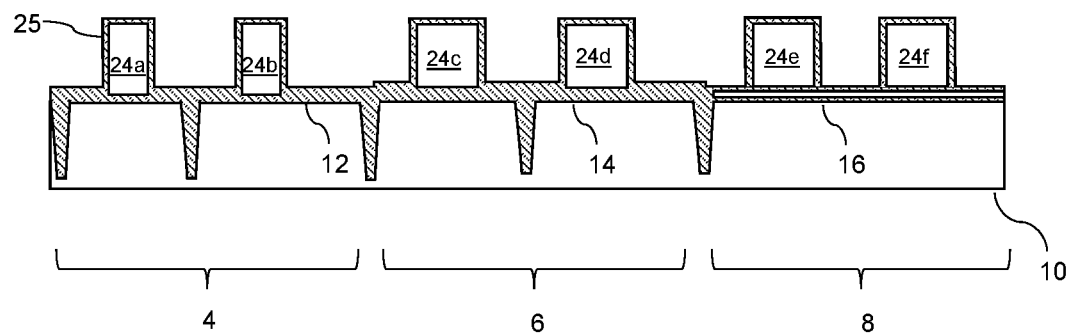

Next, as shown in FIG. 1C, the method comprises performing an oxidation step so as to form an oxide layer 25 on each of the gate structures 24a-f and exposed portions of the first and second dielectric layers 12, 14. In other words, an oxide layer 25 is formed on the sidewalls of gate structures 24a-f. The oxidation causes a growth in thickness of the first thin dielectric layer 12 and the second thick dielectric layer 14, whereas the change in the thickness of the ONO stack is negligible. This is because any further oxidation of top oxide layer of the ONO stack 16 is minimal, since there are limited silicon atoms available in the nitride layer, as most of them have would already been used in the initial oxidation of the top oxide layer. Furthermore, the nitride layer of the ONO stack 16 acts as a barrier, prohibiting the oxygen atoms from reaching the silicon on the bottom of the stack to combine with the substrate 10 silicon atoms. As such, the change in thickness of the ONO stack 16 is negligible, when compared with the oxide growth of the first and second dielectric layers 12, 14, as illustrated in FIG. 1C.

Figure 1D:
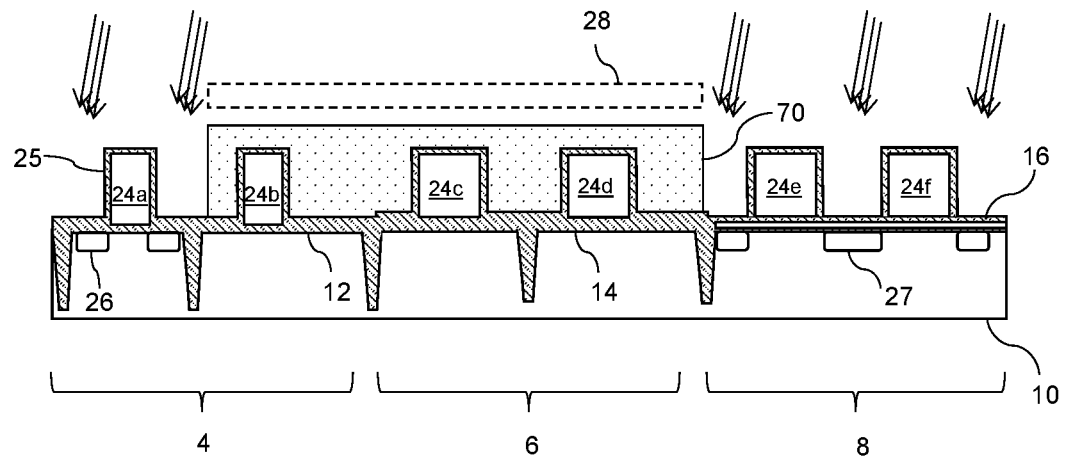

Next, the method comprises forming n-type lightly doped drain (NLDD) portions 26, 27 in the first region 4 and the third region 8. Referring to FIG. 1D, in some embodiments, the NLDD portions 26, 27 are formed by masking the second region 6 and a first portion of the first region 4 with a mask 28, leaving a first non-masked portion of the first region 4 and the third region 8 exposed, and implanting an n-type dopant in the exposed portions. In this way, the n-type dopant is implanted adjacent to the first gate structure 24a of the first region 4, and adjacent to both the first and second gate structures 24e, 24f of the third region 8. In each case, the gate structure 24a, 24e, 24f serves as a mask, such that the dopant is implanted adjacent the gate structure 24a, 24e, 24f, as shown in FIG. 1D. In other words, self-aligned gate techniques are implemented. As this process requires a photolithography step, a photoresist layer 70 covering the gate structures 24a-f is illustrated schematically in FIG. 1D, between the substrate 10 and the mask 28. The mask 28 is used only to pattern the photoresist layer 70, and while a mask is illustrated in each subsequent Figure which involves a photolithography step, in should be understood that, in practice, said mask is not present during any implant or wet etch process steps.

Figure 1E:
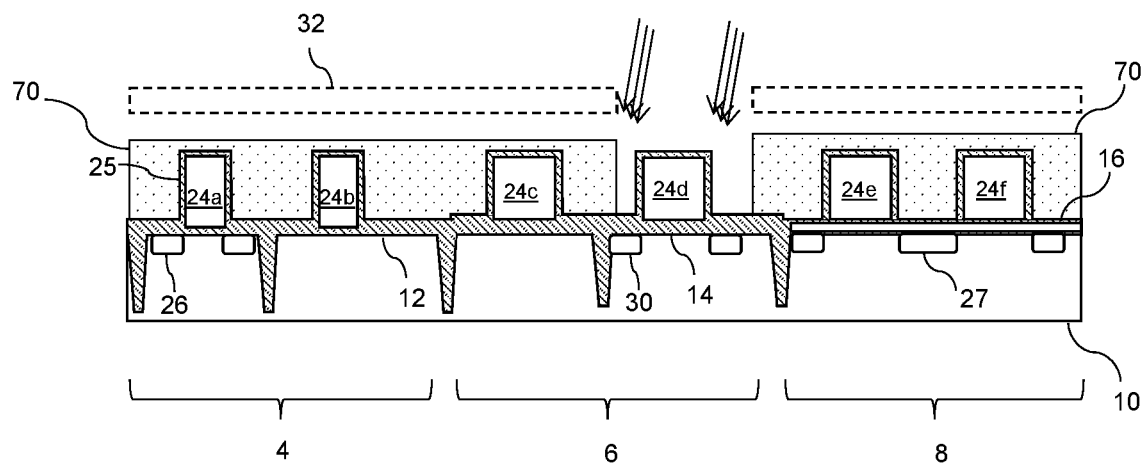

As shown in FIG. 1E, next, the method comprises forming NLDD portions 30 in the second region 6. Following an analogous process to that of FIG. 1D, in some embodiments, the NLDD portions 30 are formed by masking the first and third regions 4, 8 and a first portion of the second region 6 with a mask 32, leaving a first non-masked portion of the second region 6 exposed, and implanting an n-type dopant in said non-masked portion. The n-type dopant is implanted adjacent to the first gate structure 24d of the second region 6, wherein, as above, the gate structure 24d serves as a self-aligned mask. The LDD implants used for the first region 4 and second region 6 may have different doping values and energies. The multi-stage doping process of FIGS. 1D to 1F is suitable for such a situation.

Figure 1F:
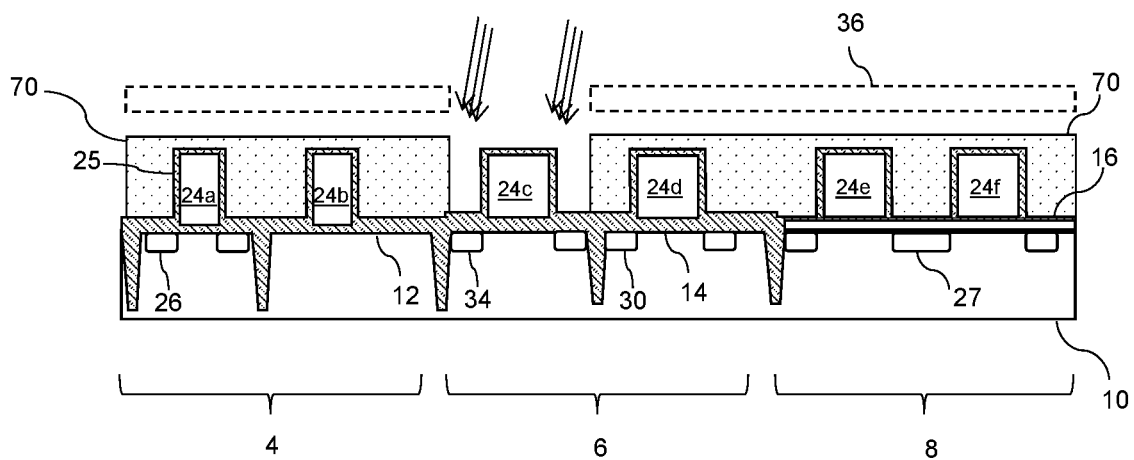

Next, referring to FIG. 1F, the method comprises forming p-type lightly doped drain (PLDD) portions 34 in in the second region 6. Following an analogous process to that of FIGS. 1D and 1E, in some embodiments, the PLDD portions 30 are formed by masking the first and third regions 4, 8 and a second portion of the second region 6 with a mask 36, leaving a second non-masked portion of the second region 6 exposed. In this case, a p-type dopant is implanted in said non-masked potion, and the gate structure 24c serves as a mask.

While the steps represented by FIGS. 1E to 1F have been described in a particular order, it should be understood that these steps could be performed in any order. In any case, the n-type dopant may comprise phosphorus ions or arsenic ions, and the p-type dopant may comprise boron, indium ions or BF2 molecules.

Figure 1G:
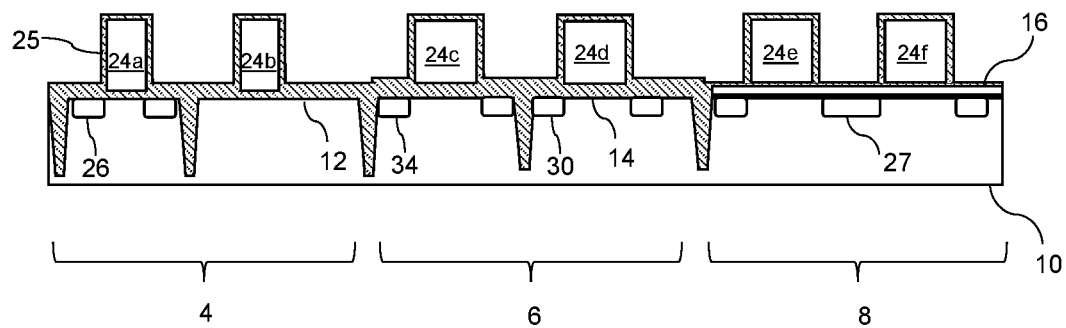

After the dopant implantation steps described in connection with FIGS. 1E to 1F, any remaining photoresist is removed, as shown in FIG. 1G. In some embodiments, at this stage the method further comprises performing an annealing step in order to activate the dopants. Any suitable method of annealing, such as rapid thermal annealing (RTA) may be implemented. A RTA step typically comprises heating the device to a high temperature (e.g. over 1000° C.) for a short period of time, followed by a more gradual cooling.

Figure 1H:
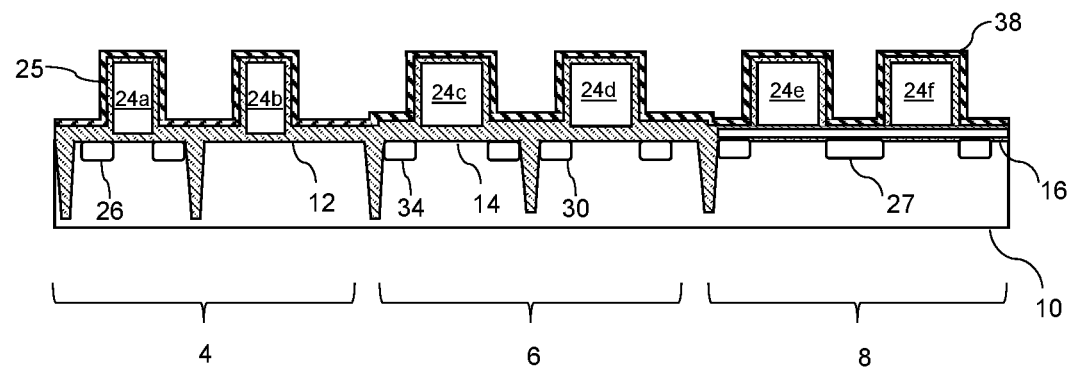

Next, a layer of tetraethyl orthosilicate (TEOS) is provided across the second and third regions 6, 8. In some embodiments, a layer of TEOS 38 is first deposited across all three regions 4, 6, 8, as shown in FIG. 1H. In this way, the TEOS forms a 'blanket' over the gate structures 24a-f, i.e. a substantially uniform layer of TEOS spanning all three regions 4, 6, 8 of the substrate 10. The TEOS layer 38 may be deposited by chemical vapour deposition (CVD). In some embodiments, low-pressure chemical vapor deposition (LPCVD) or pressure-enhanced chemical vapor deposition (PECVD) techniques are used to blanket deposit the TEOS 38.

Figure 1I:
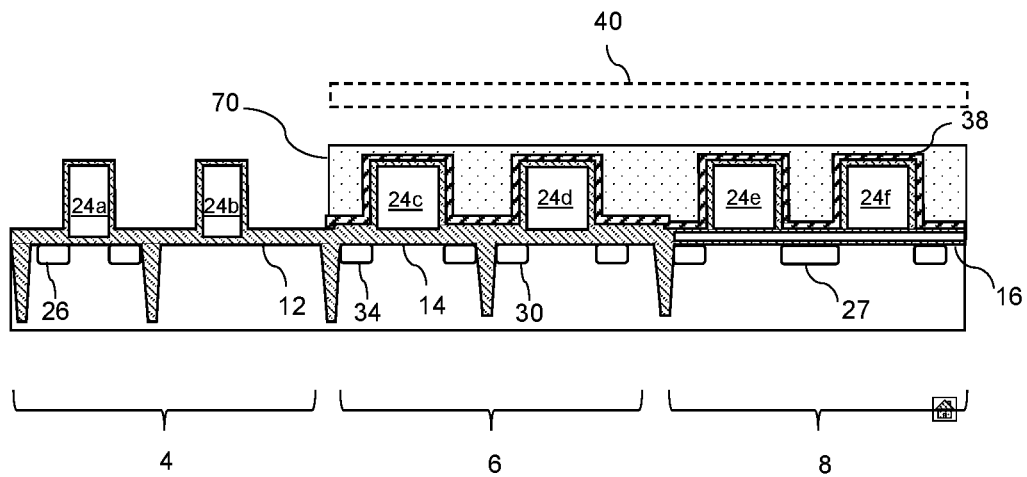

Next, the TEOS layer 38 is removed from the first region 4 of the substrate 10. In some embodiments, in order to remove the TEOS layer 38 from the first region 4 only, the second and third regions are masked with a mask 40, leaving the first region exposed, as shown in FIG. 1I. Then, a wet etching step is performed to strip the TEOS layer 38 from the first region 4, whilst leaving the underlying oxide substantially unaffected. Any suitable etchant may be used, having good selectivity to TEOS. For example, a dilute hydrofluoric acid (DHF) etch may be performed.

Figure 1J:
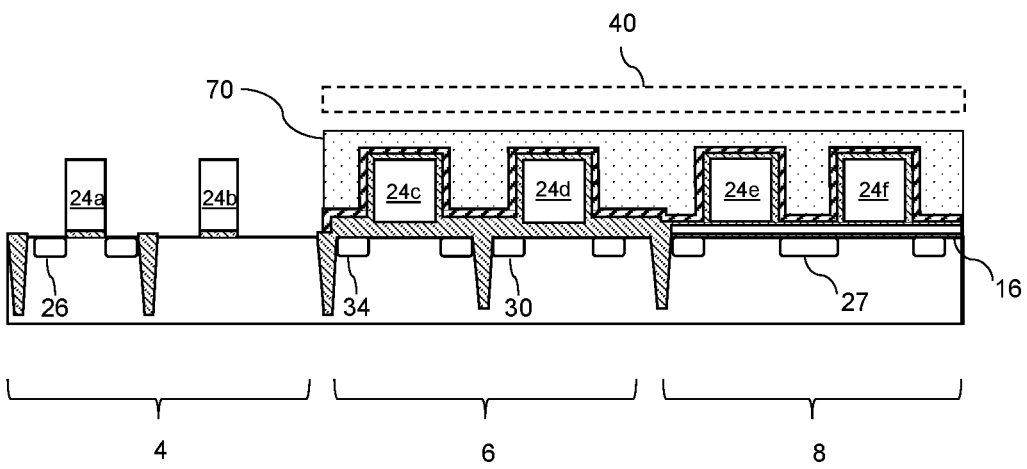
Figure 1K:
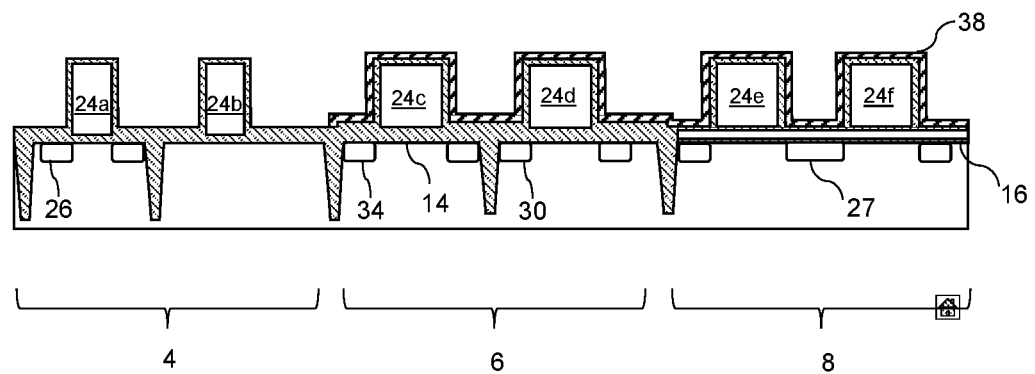

Alternatively, a buffered hydrofluoric acid (BHF) etch may be performed, so as to remove substantially remove all of the TEOS layer 38 and the oxide 20, 25 from the first region 4, as shown in FIG. 1J. This is followed by an additional oxidation step, so as to regrow an oxide layer across the first region 4, as shown in FIG. 1K. It should be understood that, in this case, there is minimal change in the oxide thickness on the second region 6 and third region 8, due to the existence of the remaining TEOS layer 38.

Figure 1L:
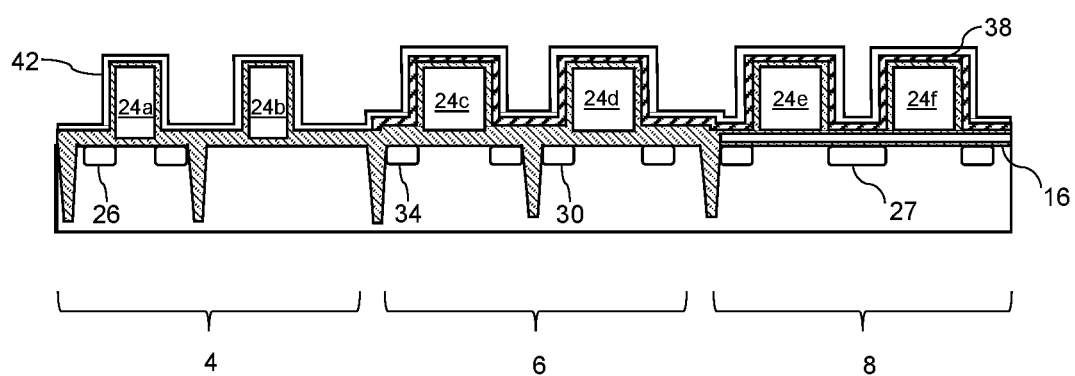
Figure 1M:
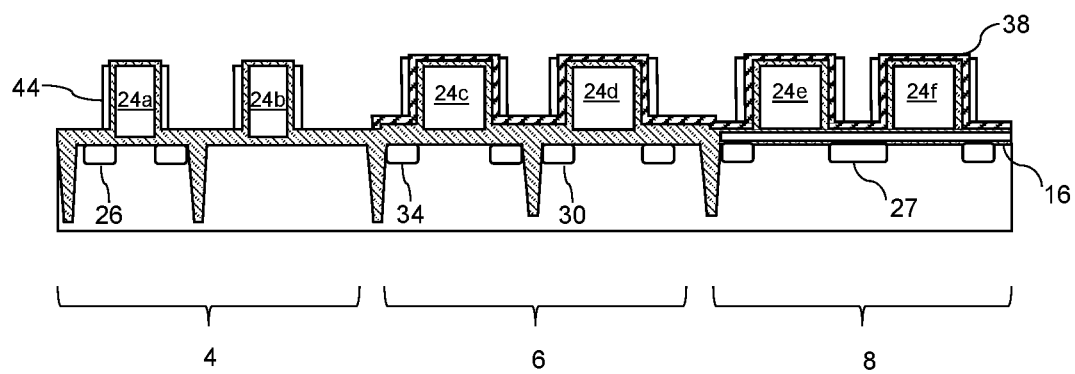

Referring to FIG. 1L, the method further comprises blanket depositing a layer of Silicon Nitride (SiN) 42 across the first, second and third regions 4, 6, 8. In some embodiments, the SiN layer 42 is deposited by CVD. After deposition of the SiN layer 42, a dry etch (e.g. plasma etch) is performed, leaving at least some of the SiN layer 42 on each gate structure 24a-f, as shown in FIG. 1M. Endpoint detection is determined when the SiN layer 42 overlying the top of gate structures 24a-f is removed. In this way, a SiN sidewall spacer portion 44 is formed on each gate structure 24a-f of the first, second and third regions 4, 6, 8, as shown in FIG. 1M. Advantageously, the TEOS layer 38 will block the dry etch over the second and third regions 6, 8, thereby protecting the ONO stack 16 from damage.

Figure 1N:
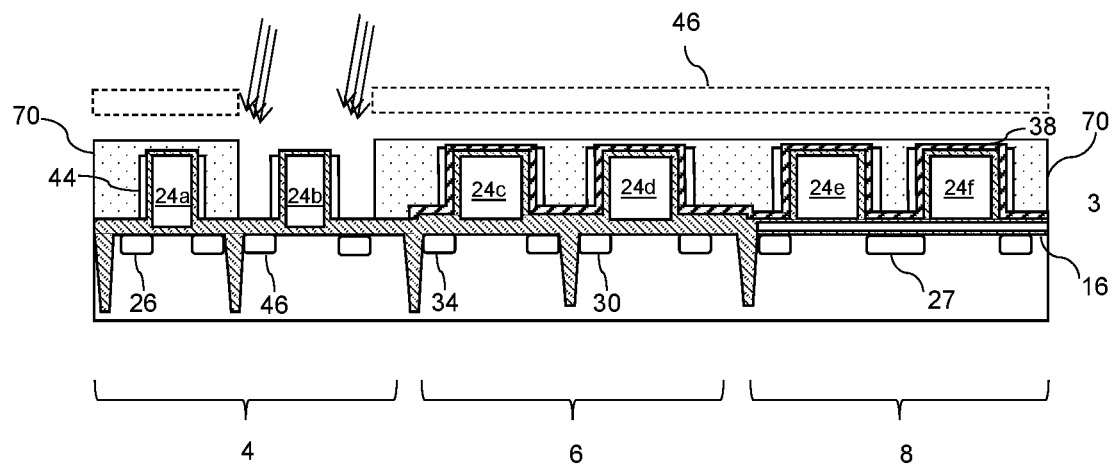

In some embodiments, after the SiN etch, PLDD portions 46 are formed in the first region 4, as shown in FIG. 1N. In order to form said PLDD portions 46, the second and third regions 6, 8 and a second portion of the first region 4 are masked with a mask 46, leaving a second non-masked portion of the first region 6 exposed. P-type ions are implanted into the substrate 10. In this case, the gate structure 24b and SiN sidewall spacer portions 44 serve as a mask, which has an increased width when compared to the gate length L1 of the gate structures 24a, 24b alone. Advantageously, due to this increase in width between the doped regions 46, the problem with the p-type dopant diffusion described above is mitigated for the PLDD portions 46 of the first region 4. While p-type dopant diffusion may also be present for the PLDD portions 34 of the second region 6, given the greater minimum gate length L2 of the gate structure 24c, the effect of the diffusion has much less of an impact.

Figure 1O:
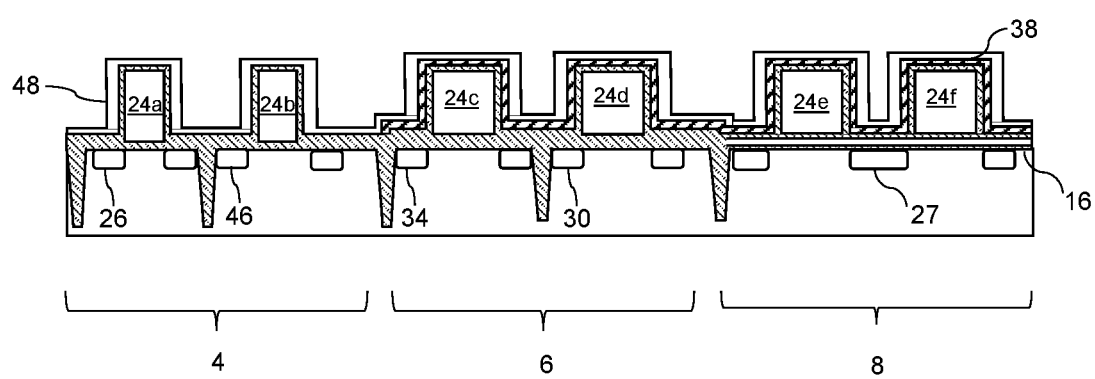
Figure 1P:
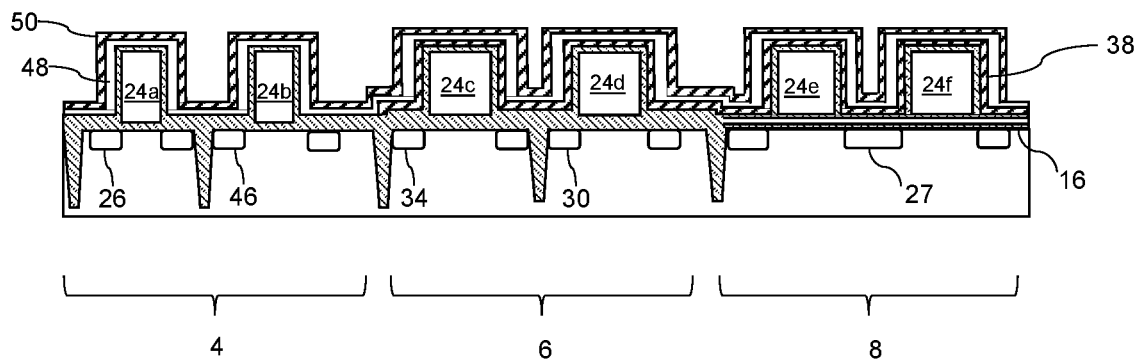

In some embodiments, the method further comprises blanket depositing a second SiN layer 48, followed by a second TEOS layer 50 across the first, second and third regions 4, 6, 8, as shown in FIGS. 1O and 1P. Due to the SiN sidewall spacer portions 44 already on each gate structure 24a-f, in effect, the second SiN layer 48 has an increased thickness on the gate structure 24a-f sidewalls (when compared to the parts of the second SiN layer 48 not on said sidewalls). As above, the second SiN layer 48 and second TEOS layer 50 may be deposited by CVD, for example, by LPDCVD or PEVCD.

Figure 1Q:
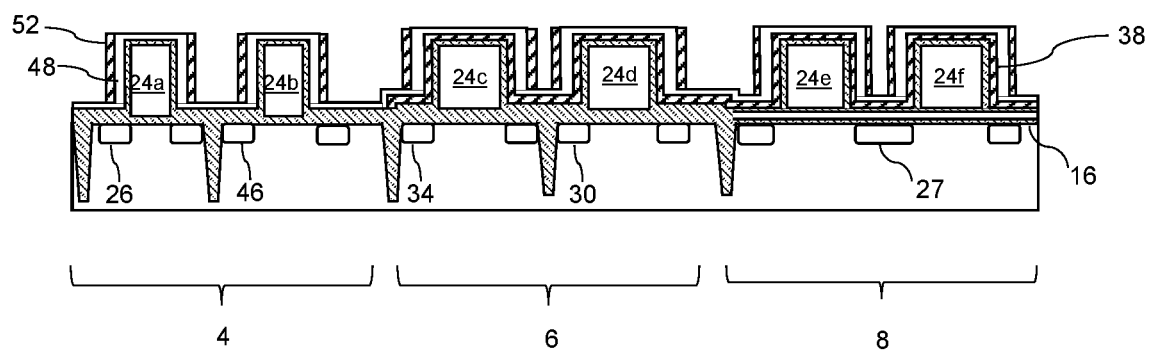

Referring to FIG. 1Q, in some embodiments, the method further comprises etching the second TEOS 50 layer leaving at least some of said second TEOS layer 50 on each gate structure so as to form a first TEOS sidewall spacer portion 52 on each gate structure 24a-f of the first, second and third regions 4, 6, 8. Endpoint detection is determined when the second TEOS layer 50 overlying the top of gate structures 24a-f is removed, such that a TEOS sidewall spacer portion 52 is formed on each gate structure 24a-f of the first, second and third regions 4, 6, 8. In this way, the second SiN layer 48 is exposed atop the gate structures 24a-f and on the areas between said gate structures 24a-f.

Figure 1R:
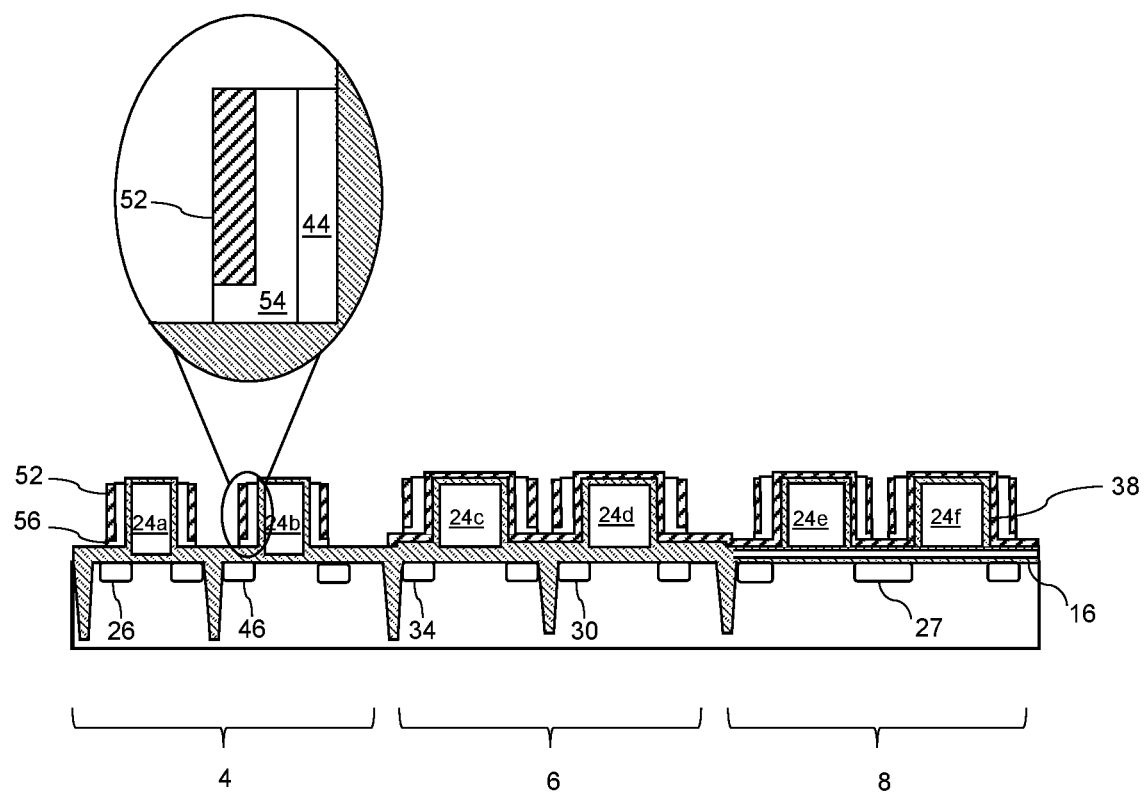

Next, as shown in FIG. 1R, the method comprises etching the second SiN layer 48 leaving at least some of said second SiN layer 48 on each gate structure so as to form a second SiN sidewall spacer portion 54 on each gate structure of the first, second and third regions 4, 6, 8. In some embodiments, a dry etch (e.g. plasma etch) is performed. As shown in the zoomed-in region of FIG. 1R, the first SiN spacer portion 44 and second SiN spacer portion 54 in effect form an L-shaped SiN sidewall spacer 56. Advantageously, L-shaped spacers may provide a better bridging immunity when compared to conventional I-shaped spacers—particularly when the distance between gate structures is decreased to optimise the transistor density (as discussed below).

Figure 1S:
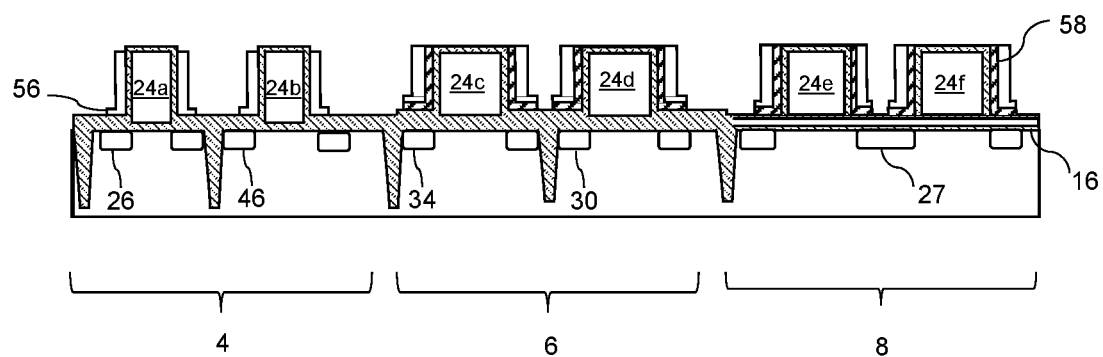

Finally, as illustrated in FIG. 1S, the method further comprises performing a wet etching leaving at least some of said first TEOS layer 38 on each gate structure 24c-f of the second and third regions 6, 8 so as to form a second TEOS sidewall spacer portion 58 on each gate structure 24c-f of the second and third regions 6, 8. It can be seen that the a dual spacer (i.e. a spacer composed of both SiN and TEOS) is provided on the gate structures 24c-f of the second and third regions 6, 8, whereas in the first region 4, a SiN spacer is provided. It can be seen that the thickness of the first TEOS layer 38 determines the difference in lateral thicknesses between the sidewall spacers on the first region 4 when compared to the second and third regions 6, 8. Advantageously, the extra thickness due to the TEOS spacer 58 permits the transistors formed on the second region 6 to have a higher operating voltage than on the first region 4, as discussed above.

Figure 2:
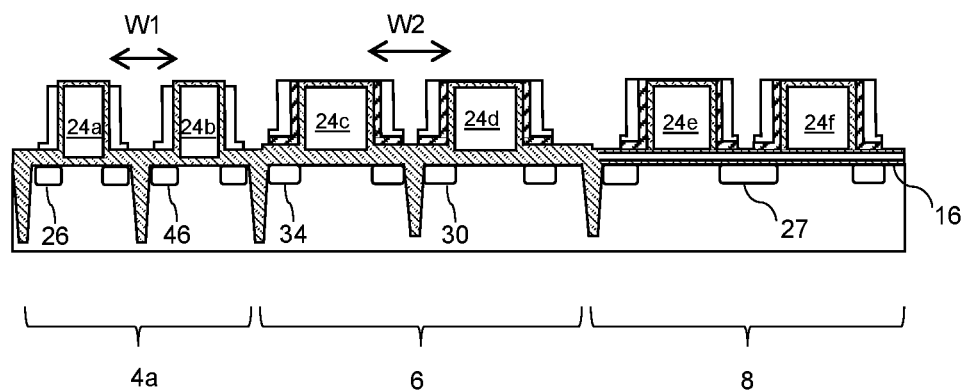
FIG. 2 is a cross-sectional view of a portion of a semiconductor device according to an embodiment of the present invention.

Furthermore, the thinner spacer on gate structures 24a-b means that the distance between said gate structures 24a-b can be reduced. This reduction in distance is illustrated in FIG. 2, wherein the distance W1 between the gate structures 24a-b of the first region 4a is smaller than the distance W2 between the gate structures 24c-d of the second region 6. In this way, the transistor spacing on the first region 4a is optimised, thereby maximizing the density of transistors provided on the substrate 10.

Figure 3A:
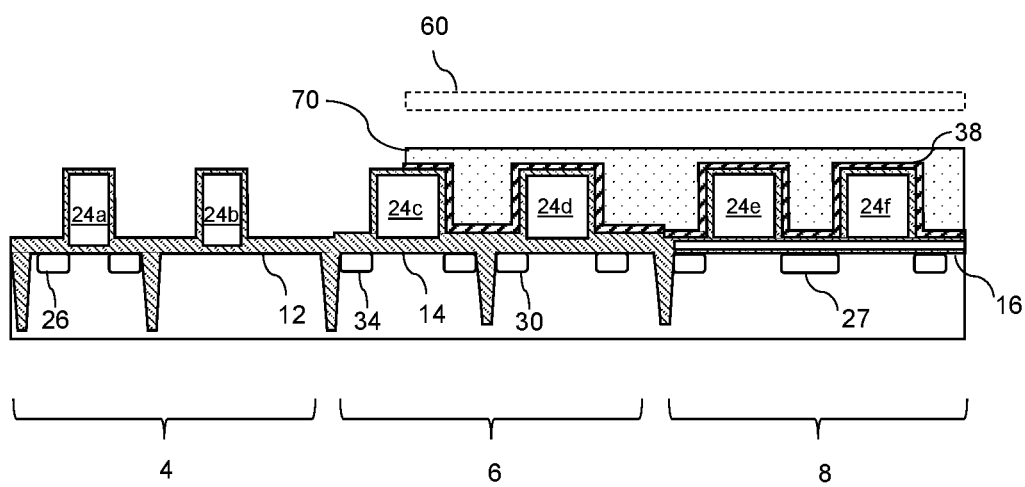
FIGS. 3A and 3B are cross-sectional views of a portion of a semiconductor device according to an embodiment of the present invention.

FIG. 3A illustrates a step of the method, which is alternative to the step as described in connection with FIG. 1I. In this alternative embodiment, the TEOS layer 38 is not only removed from the first region 4, but also from a part of the second region 6. In this case, a mask 60 is provided overlying the third region 8 and part of the second region 6, leaving approximately half of gate structure 24c exposed. In particular, the source side of the gate structure 24c is exposed, while the drain side is covered by the mask 60. In some embodiments, a Deep-Ultra Violet (DUV) mask may be used in order to permit highly precise etching. Then, a wet etching step is performed to strip the TEOS layer 38 from the first region 4 and the exposed part of the second region 6, whilst leaving the underlying oxide substantially unaffected. As discussed above in connection with FIG. 1I, any suitable etchant may be used, having good selectivity to TEOS, such as dilute hydrofluoric acid (DHF). Alternatively, as with FIGS. 1J and 1K, a buffered hydrofluoric acid (BHF) etch may be performed to remove substantially remove all of the TEOS layer 38 and the oxide 20, 25 from the first region 4 and the exposed part of the second region 6, followed by an additional oxidation step, so as to regrow an oxide layer across the exposed portions. In either case, as a result, the remaining TEOS layer 38 covers approximately half of each of the gate structure 24c of the second region 6.

Figure 3B:
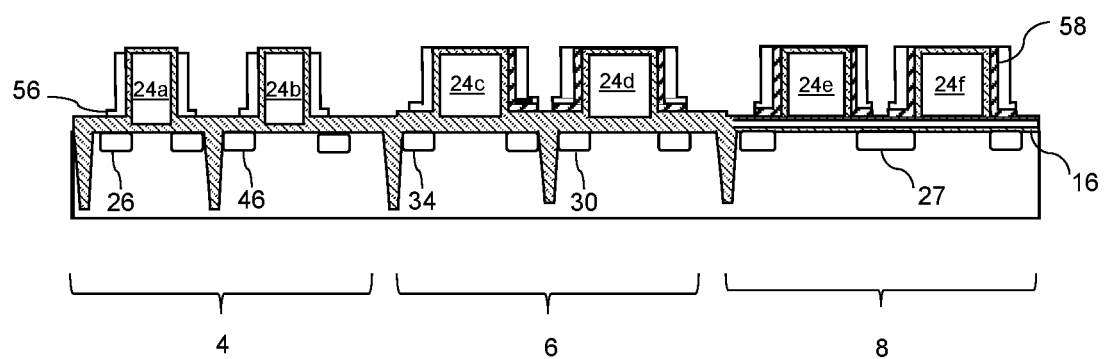

After removing the TEOS layer 38 from the first region 4 and the parts of the second region 6, essentially the same steps of the method as described in connection with FIGS. 1L to 1S are performed. As a result, the gate structure 24c of the second region 6 is provided with asymmetric sidewall spacer portions, as shown in FIG. 3B. By 'asymmetric', it is meant that the source side of the gate structure 24c is provided with a SiN sidewall spacer substantially the same as those formed on the gate structures 24a,b of the first region 4 (i.e. the L-shaped SiN sidewall spacer 56), whereas the drain side of the gate structure 24c is provided with a composite SiN and TEOS spacer. In this way, there is an asymmetry in the spacer thicknesses on the source and drain sides of the pMOS gate structure 24c, whereas the spacer portions on the nMOS gate structure 24d are symmetric.

In some embodiments, rather than the pMOS gate structure 24c, it is the nMOS gate structure 24d which is provided with asymmetric spacer portions, while the pMOS gate structure 24c has symmetric spacer portions. In this case, the mask 60 covers the pMOS gate structure 24c, while approximately half of the nMOS gate structure 24d is exposed.

Figure 4A:
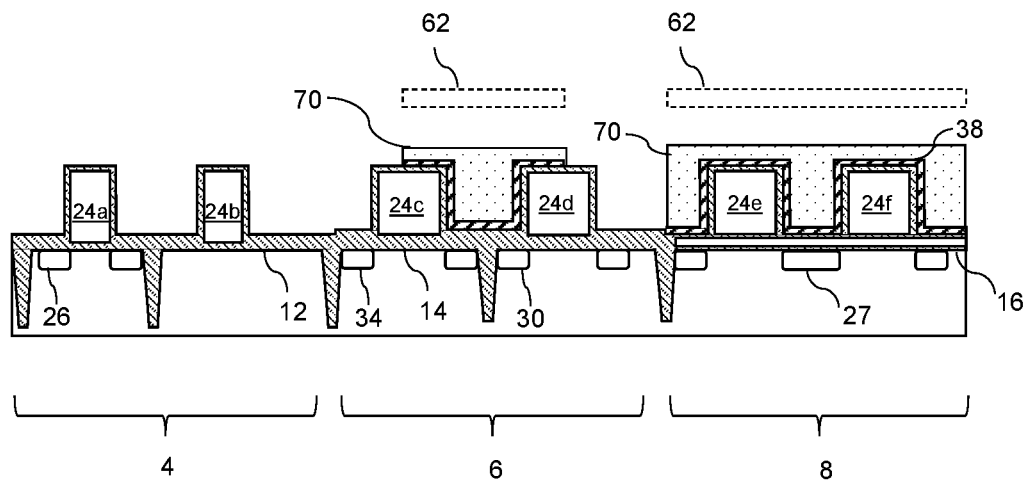
FIGS. 4A and 4B are cross-sectional views of a portion of a semiconductor device according to an embodiment of the present invention.

FIG. 4A illustrates a further alternative step of the method to the step as described in connection with FIG. 1I. In this alternative embodiment, the TEOS layer 38 is not only removed from the first region 4, but also from parts of the second region 6 overlying both of the gate structures 24c,d. A mask 62 is provided overlying the third region 8 and part of the second region 6, leaving approximately half of both gate structures 24c,d exposed. In some embodiments, a Deep-Ultra Violet (DUV) mask may be used in order to permit highly precise etching. Then, a wet etching step is performed to strip the TEOS layer 38 from the first region 4 and the exposed part of the second region 6, whilst leaving the underlying oxide substantially unaffected. As discussed above in connection with FIG. 1I, any suitable etchant may be used, having good selectivity to TEOS, such as dilute hydrofluoric acid (DHF). Alternatively, a buffered hydrofluoric acid (BHF) etch may be performed to remove substantially remove all of the TEOS layer 38 and the oxide 20, 25 from the first region 4 and the exposed part of the second region 6, followed by an additional oxidation step, so as to regrow an oxide layer across the exposed portions. In either case, as a result, the remaining TEOS layer 38 covers approximately half of each of the gate structures 24c,d of the second region 6.

Figure 4B:
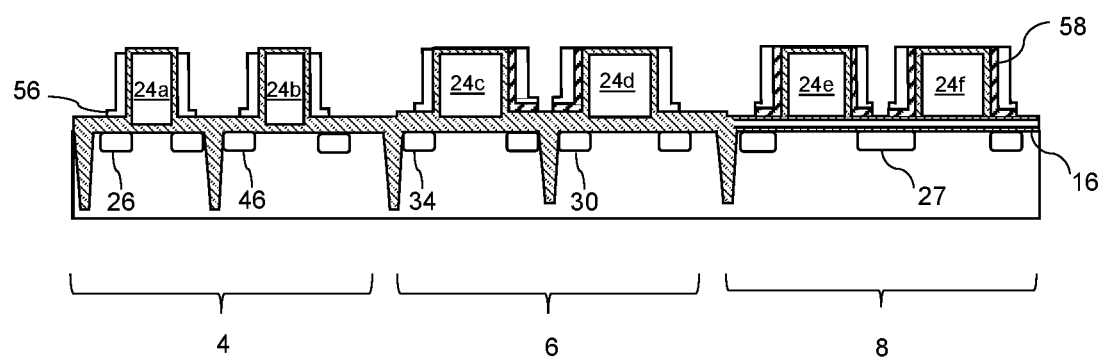

After removing the TEOS layer 38 from the first region 4 and the parts of the second region 6, essentially the same steps of the method as described in connection with FIGS. 1L to 1S are performed. As a result, both of the pMOS gates structure 24c and the nMOS gate structure 24d of the second region 6 are provided with asymmetric sidewall spacer portions, as shown in FIG. 4B. As above, by 'asymmetric', it is meant that the source side of each gate structure 24c,d is provided with a SiN sidewall spacer substantially the same as those formed on the gate structures 24a,b of the first region 4 (i.e. the L-shaped SiN sidewall spacer 56), whereas the drain side of each gate structure 24c,d is provided with a composite SiN and TEOS spacer. As such, there is an asymmetry in the spacer thicknesses on the source and drain sides of both gate structures 24c,d in the second region 6.

The asymmetric spacer configurations as described in connection with FIGS. 3B and 4B may provide a number of benefits. Firstly, the performance of the nMOS or pMOS is improved, as the asymmetric spacer permits an increase of on-current, without hot carrier degradation effects. Furthermore, the reduced spacer thickness means that the spacing between the gate structures can also be reduced in order to optimise the transistor spacing and maximise the density of transistors provided on the substrate. More generally, the choice of the mask patterning effectively quadruples the number of types of devices which can be manufactured, without needing to introduce additional steps to the process. Specifically, the choice of mask patterning permits the following four options: (i) both gate structures 24c,d have symmetric spacers (FIG. 1S); (ii) both gate structures 24c,d have asymmetric spacers (FIG. 4B); (iii) the pMOS gate structure 24c has asymmetric spacers while the nMOS gate structure 24d has symmetric spacers (FIG. 3A); and (iv) the nMOS gate structure 24d has asymmetric spacers while the pMOS gate structure 24c has symmetric spacers.

Figure 5:
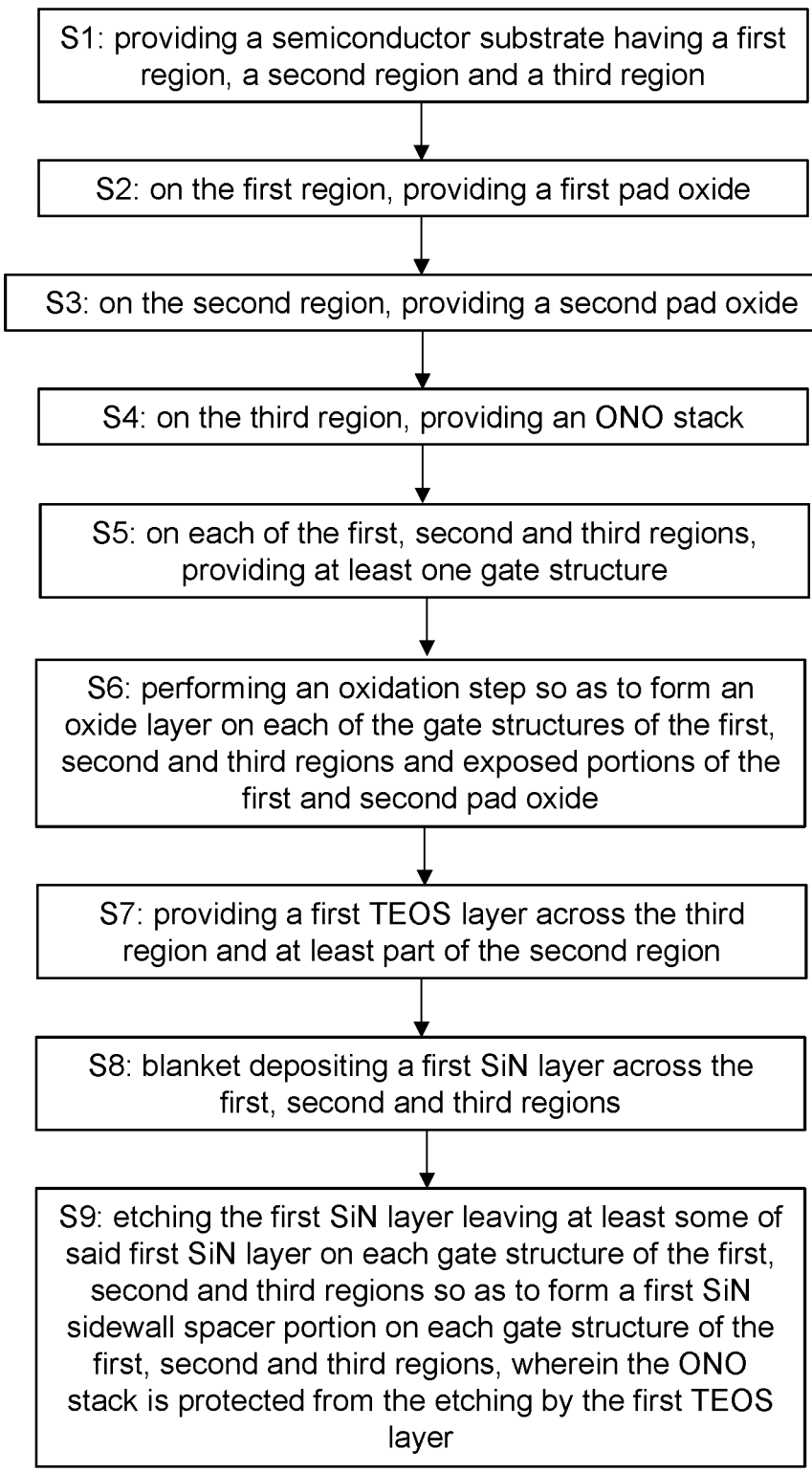
FIG. 5 is a flow diagram of a method of manufacturing a semiconductor device.

FIG. 5 is a flow diagram of the method, as described above. The method starts with providing a semiconductor substrate 10 having a first region 4, a second region 6 and a third region 8 (step S1). The method further comprises, on the first region 4, providing a first dielectric layer (step S2); on the second region 6, providing a second dielectric layer (step S3); and on the third region 8, providing a ONO stack (step S4). The method further comprises, on each of the first, second and third regions 4, 6, 8, providing at least one gate structure 24a-f (step S5); performing an oxidation step so as to form an oxide layer on each of the gate structures of the first, second and third regions 4, 6, 8 and exposed portions of the first and second dielectric layers (step S7); and providing a first TEOS layer 38 across the third region 8 and at least part of the second region 6 (step S8). The method further comprises blanket depositing a first SiN layer across the first, second and third regions (S8), and etching the first SiN layer leaving at least some of said first SiN layer on each gate structure of the first, second and third regions so as to form a first SiN sidewall spacer portion on each gate structure of the first, second and third regions (step S9). The SONOS stack is protected from the etching by the first TEOS layer.

While specific embodiments of the invention have been described above, it will be appreciated that the invention may be practiced otherwise than as described. The descriptions above are intended to be illustrative, not limiting. It will be apparent to one skilled in the art that modifications may be made to the invention as described without departing from the scope of the claims set out below.

Each feature disclosed or illustrated in the present specification may be incorporated in the invention, whether alone or in any appropriate combination with any other feature disclosed or illustrated herein.

The invention claimed is:

1. A method of manufacturing of a semiconductor device, comprising:
    providing a semiconductor substrate having a first region, a second region and a third region;
    on the first region, providing a first dielectric layer;
    on the second region, providing a second dielectric layer;
    on the third region, providing an ONO stack;
    on each of the first, second and third regions, providing at least one gate structure;
    performing an oxidation step so as to form an oxide layer on each of the gate structures of the first, second and third regions and exposed portions of the first and second dielectric layers;
    providing a first tetraethyl orthosilicate, TEOS, layer across the third region to cover a part of the ONO stack extending laterally out from under the at least one gate structure on the third region, and across at least part of the second region;
    blanket depositing a first silicon nitride, SiN, layer across the first, second and third regions; and
    etching the first SiN layer leaving at least some of said first SiN layer on each gate structure of the first, second and third regions so as to form a first SiN sidewall spacer portion on each gate structure of the first, second and third regions, wherein the part of the ONO stack extending laterally out from under the at least one gate structure is protected from the etching by the first TEOS layer.

2. The method of claim 1, further comprising:
    blanket depositing a second SiN layer across the first, second and third regions; and
    blanket depositing a second TEOS layer across the first, second and third regions.

3. The method of claim 2, further comprising:
    etching the second TEOS layer leaving at least some of said second TEOS layer on each gate structure so as to form a first TEOS sidewall spacer portion on each gate structure of the first, second and third regions; and
    etching the second SiN layer leaving at least some of said second SiN layer on each gate structure so as to form a second SiN sidewall spacer portion on each gate structure of the first, second and third regions.

4. The method of claim 3, further comprising:
    performing a wet etching leaving at least some of said first TEOS layer on each gate structure of the second and third regions so as to form a second TEOS sidewall spacer portion on each gate structure of the second and third regions.

5. The method of claim 4, wherein said step of performing a wet etching leaving at least some of said first TEOS layer on each gate structure of the second and third regions so as to form a second TEOS sidewall spacer portion on each gate structure of the second and third regions comprises:
    etching so as to remove the first TEOS sidewall spacer portions from each gate structure of the first, second and third regions and a part of the first TEOS layer not protected by the first and second SiN sidewall spacer portions.

6. The method of claim 1, wherein the first dielectric layer has a first thickness and the second dielectric layer has a second thickness, and wherein the second thickness is greater than the first thickness.

7. The method of claim 1, wherein providing at least one gate structure on each of the first, second and third regions comprises:
    depositing, on the first, second and third regions, a gate material;
    depositing, on the gate material, a hard mask; and
    etching to remove some of the hard mask and gate material so as to form the at least one gate structure on each of the first, second and third regions.

8. The method of claim 1, wherein after, on each of the first, second and third regions, providing at least one gate structure, the method further comprises:
    forming a plurality of isolation structures in the substrate.

9. The method of claim 1, wherein the at least one gate structure on each of the first, second and third regions comprises a first gate structure and a second gate structure.

10. The method of claim 9, wherein after performing the oxidation step, the method further comprises:
    in the first region, forming n-type lightly doped drain, NLDD, portions adjacent the first gate structure of the first region;
    in the third region, forming NLDD portions adjacent to the first and second gate structures of the third region; and
    in the second region of the substrate, forming NLDD portions adjacent the first gate structure of the second region and p-type lightly doped drain, PLDD, portions adjacent the second gate structure of the second region.

11. The method of claim 10, wherein, in the first region of the substrate, forming NLDD portions adjacent the first gate structure of the first region and in the third region, forming NLDD portions adjacent to the first and second gate structures of the third region comprises:
    masking the second region and a first portion of the first region, leaving a first non-masked portion of the first region and the third region exposed; and
    in the first non-masked portion and the third region, implanting an n-type dopant.

12. The method of claim 10, wherein, in the second region of the substrate, forming NLDD portions adjacent the first gate structure of the second region and PLDD portions adjacent the second gate structure of the second region comprises:
    masking the first and third regions and a first portion of the second region, leaving a first non-masked portion of the second region exposed;
    in the first non-masked portion, implanting an n-type dopant adjacent to the first gate structure of the second region;
    masking the first and third regions and a second portion of the second region, leaving a second non-masked portion of the second region exposed;
    in the second non-masked portion, implanting a p-type dopant adjacent to the second gate structure of the second region.

13. The method of claim 9, wherein after etching the first SiN layer leaving at least some of said first SiN layer on each gate structure of the first, second and third regions so as to form a first SiN sidewall spacer portion on each gate structure of the first, second and third regions, the method further comprises:
  in the first region of the substrate, forming PLDD portions.

14. The method of claim 13, wherein, in the first region of the substrate, forming PLDD portions comprises:
  masking the second and third regions and a second portion of the first region, leaving a second non-masked portion of the first region exposed; and
  in the second non-masked portion, implanting a p-type dopant adjacent to the second gate structure of the first region.

15. The method of claim 1, wherein said step of providing a first TEOS layer across the third region and at least part of the second region comprises:
  blanket depositing a TEOS layer across the first, second and third regions;
  removing the first TEOS layer from the first region.

16. The method of claim 15, wherein said step of removing the first TEOS layer from the first region comprises:
  masking the second and third regions, leaving the first region exposed; and
  performing a wet etch to remove the TEOS layer from the first region.

17. The method of claim 16, wherein said step of performing a wet etch to remove the TEOS layer from the first region comprises:
  using a dilute hydrofluoric acid, DHF, etch to remove the TEOS layer; or
  using a buffered hydrofluoric acid, BHF, etch to remove the TEOS layer and the oxide layer from the first region, and performing an oxidation step so as to regrow an oxide layer across the first region.

18. The method of claim 9, wherein said step of providing a first TEOS layer across the third region and at least part of the second region comprises:
  blanket depositing a TEOS layer across the first, second and third regions;
  removing the first TEOS layer from the first region and a part of the second region.

19. The method of claim 18, wherein said step of removing the first TEOS layer from the first region and a part of the second region comprises:
  masking the third region and a part of the second region, leaving the first region and a part of the second region exposed; and
  performing a wet etch to remove the TEOS layer from the first region and the exposed part of the second region;
  wherein the exposed part of the second region comprises: an area over part of the first gate structure; an area over part of the second gate structure; or an area over part of the first gate structure and part of the second gate structure.

20. The method of any preceding claim, wherein the first SiN layer is deposited by CVD.

21. A semiconductor device comprising:
  a semiconductor substrate having a first region, a second region and a third region;
  a first dielectric layer on the first region;
  a second dielectric layer on the second region;
  a ONO stack on the third region;
  on each of the first, second and third regions, at least one gate structure;
  a TEOS spacer portion adjacent each gate structure of the second and third regions; and
  a SiN spacer portion adjacent each of the gate structures of the first region and on each of the TEOS spacer portions of the second and third regions, wherein a part of the ONO stack extends laterally from under the at least one gate structure on the third region.

22. The semiconductor device of claim 21, further comprising:
  an oxide layer on each of the gate structures and exposed portions of the first and second dielectric layers.

23. The semiconductor device of claim 21, further comprising:
  n-type lightly doped drain, NLDD, and p-type lightly doped drain, PLDD, portions in each of the first and second regions of the substrate.

24. The semiconductor device of claim 21, wherein at least two gate structures are provided on each of the first, second and third regions.

25. The semiconductor device of claim 21, wherein each gate structure has a source side and a drain side, and wherein the TEOS spacer portion adjacent each gate structure of the second region is provided symmetrically on both the source side and the drain side of each gate structure.

26. The semiconductor device claim 21, wherein said TEOS spacer portion is asymmetric on at least one gate structure in the second region.

27. The semiconductor device of claim 26, wherein said TEOS spacer portion is asymmetric on each gate structure in the second region.

28. The semiconductor device of claim 26, wherein each gate structure has a source side and a drain side, and wherein the TEOS spacer portion adjacent at least one gate structure of the second region is provided on the drain side of the at least one gate structure and not the source side.

* * * * *